US 7,165,207 B2

(12) United States Patent
Olivieri et al.

(10) Patent No.: US 7,165,207 B2
(45) Date of Patent: Jan. 16, 2007

(54) ROBUST SIGNAL CODING

(75) Inventors: Stefano Olivieri, Milan (IT); Leonardo Camiciotti, Florence (IT)

(73) Assignee: Koninklijke Philips Electronics N.V., Eindhoven (NL)

( * ) Notice: Subject to any disclaimer, the term of this patent is extended or adjusted under 35 U.S.C. 154(b) by 21 days.

(21) Appl. No.: 10/501,425

(22) PCT Filed: Jan. 14, 2003

(86) PCT No.: PCT/IB03/00072

§ 371 (c)(1),
(2), (4) Date: Jul. 13, 2004

(87) PCT Pub. No.: WO03/061137

PCT Pub. Date: Jul. 24, 2003

(65) Prior Publication Data

US 2005/0180509 A1    Aug. 18, 2005

(30) Foreign Application Priority Data

Jan. 18, 2002    (EP)    ................... 02075225

(51) Int. Cl.
  *G03M 13/00*    (2006.01)
(52) U.S. Cl. .................................................. 714/774
(58) Field of Classification Search ................. 704/207
  See application file for complete search history.

(56) References Cited

U.S. PATENT DOCUMENTS 6,289,485 B1 *   9/2001   Shiomoto ................... 714/779
6,754,277 B1 *   6/2004   Heinzelman et al. .. 375/240.27
2002/0158781 A1 *   10/2002   Martini et al. ................ 341/59
2003/0081592 A1 *   5/2003   Krishnarajah et al. ...... 370/352
2004/0010609 A1 *   1/2004   Vilander et al. ............ 709/230
2004/0132442 A1 *   7/2004   Zimmerman et al. ....... 455/423
2004/0233903 A1 *   11/2004   Samaras et al. ............ 370/389

OTHER PUBLICATIONS

"An FEC-Based Error Control Scheme for Wireless MPEG-4 Video Transmission", by Jianfei Cai et al., pp. 1243-1247.
"Proportional Unequal Error Protection for MPEG-4 Video transmission", by Maria Martini et al., pp. 1033-1037.
"Channel Coding and Transmission Aspects for Wireless Multimedia", by Joachim Hagenauer et al., pp. 1764-1777.

* cited by examiner

*Primary Examiner*—Albert Decady
*Assistant Examiner*—Sam Rizk
(74) *Attorney, Agent, or Firm*—Larry Liberchuk

(57) ABSTRACT

The present invention concerns methods and devices for coding and decoding a coded data stream as well as a signal format for a coded data stream. The coded data stream includes at least one high-level data packet having partitions of data (56, 62, 68) requiring different protection rates. Partition detectors (50) are inserted between two such partitions by a partition detector inserter, in order to provide guidance for coding the partitions with different protection rates. Information about the code rates used for the different fields is extracted by a controller on the receiving side in order to decode the partitions with the right code rate.

16 Claims, 7 Drawing Sheets

ROBUST SIGNAL CODING

TECHNICAL FIELD

The present invention relates in general to robust signal coding and more particularly to methods of coding and decoding coded data streams, devices for coding and decoding coded data streams as well as to a signal format for a coded data stream.

BACKGROUND OF THE INVENTION

The article of Hagenauer, J. and Stockhammer, T. "Channel Coding and Transmission Aspects for Wireless Multimedia", Proceedings of IEEE, Vol. 87, No. 10, October 1999, discloses joint source/channel coding and decoding methods for multimedia. Multimedia has to handle a variety of compressed and uncompressed source signals such as data, text, image, audio and video. On wireless channels the error rates are high and joint source/channel coding and decoding methods are advantageous.

In the heterogeneous world of communication the layered structure is an important feature for standardization, design and implementation. Usually one layer only communicates with the corresponding layer at the receiver side by using the lower layers to fulfil the requests of the upper layer. For both standardization and implementation, only the definition of interfaces and tasks for each layer is necessary, whereby the interface definition is quite simple. The layer is usually described using a state machine. There also exists a very clear separation in the layer model: end-to-end applications are transported over different physical media like optical fibre, copper wires or wireless within one connection.

In contrast to the layer structure, an optimisation of compression and transmission stretching across the layers might be useful in the mobile environment. The source coding scheme and even the application control could be influenced by the state of the mobile channel and the available resources. Some services might be restricted because of error, complexity and delay constraints. Communication systems optimised to both the application and channel might be of interest in the future for very bandwidth and power efficient transmission.

If there is some knowledge about the source properties, i.e. bit sensitivity measurements or source significant information, or if the application provides base information separated from enhancement information, Unequal Error Protection (UEP) methods should be applied by using advanced channel coding algorithms or modulation techniques. The more important base information is highly protected to guarantee delivery and the less important enhancement information is either low protected or in bad channel connections even not transmitted.

One way of indicating such different types of protection is by using SSI (Source Significant Information) fields in the transmitted data. PCT-application EP01/07759 filed May 07, 2001 describes the insertion of such fields in transmitted data. Here an SSI header is placed before each packet of source data. The SSI header contains the sizes of the partitions having different needs for protection and the code rate to be used for protecting the partitions. These SSI headers are in some cases preceded by a pseudo-random word in the form of a pseudo-noise sequence: Reference is here made to John G. Proakis, "Digital communications", $2^{nd}$ edition, McGraw-Hill, 1989, pp. 601–817, pp. 831–836. A preferred pseudo-noise sequence is a Gold sequence, which is known in the art. Pseudo-noise sequences have auto-correlation properties particularly suitable for detection and/or synchronization.

The problem with these SSI headers is that they are inserted into data packets at one high level layer in the communication structure, while the coding using UEP protection is done at a lower level. Because of the limited size of the data packets at the lower level, the high-level data packets can be split into different low-level packets. This phenomenon is also called packet fragmentation. If this happens the receiver can then be unable to decode a data packet coded with UEP, since the information regarding how the data in the packet is to be decoded would be included in another packet. This can thus lead to a loss of information on the receiver side. There is thus a need for a more robust coding scheme, where the negative results of packet fragmentation is limited or completely avoided.

SUMMARY OF THE INVENTION

It is therefore an object of the present invention to solve the above-mentioned problem associated with packet fragmentation in order to provide a more robust coding scheme.

This is achieved by a coding scheme where a coded data stream comprising at least one high level data packet having partitions of data requiring different protection rates, comprising the step of inserting a partition detector between two such partitions, in order to provide guidance for coding the partitions with different protection rates.

This problem is solved by a method of coding a coded data stream comprising at least one high-level data packet having partitions of data requiring different protection rates with the step of inserting a partition detector between two such partitions, in order to provide guidance for coding the partitions with different protection rates.

This problem is also solved by a method of decoding a coded data stream through receiving a coded data stream including at least one low level data packet having at least two partitions coded with different code rates, extracting information from at least one partition detector inserted between two partitions in the low level data packet and decoding the different partitions with different code rates based upon code rate information extracted from the partition detector.

This problem is furthermore solved by a device for coding a coded data stream comprising at least one high level data packet having partitions of data requiring different protection rates having a partition detector inserter for inserting said partition detector between two such partitions, in order to provide guidance for coding the partitions with different protection rates.

This problem is also solved by a device for decoding a coded data stream having at least two low level data packets including partitions of data having different protection rates comprising a controller for reading partition detector information inserted between two such partitions and a decoder for decoding the two partitions at two different protection rates obtained from the partition detector.

This problem is furthermore solved by a signal format for use in transmitting a coded data stream comprising a first partition coded with a first code rate, a partition detector and a second partition coded with a second code rate. The partition detector indicates both the first and the second code rates.

With the present invention there is thus provided a more robust coding scheme in which information about the code rate used for a partition of data can easily be obtained despite packet fragmentation.

The term comprising in no way to be interpreted limiting, but is to be understood to be equivalent to the term including.

A preferable field of application of the invention is wireless transmission of MPEG-4 video. The article of Heinzelman, W. R., Budagavi, M. and Talluni, R., "Unequal Error Protection of MPEG-4 Compressed Video", Proceedings of the International Conference on Image Processing (ICIP), October 1999, discloses that the structure of an MPEG-4 compressed bit-stream lends itself to using unequal error protection to ensure fewer errors in the important portions of the bit-stream.

BRIEF DESCRIPTION OF THE DRAWINGS

The invention will now be described in more detail with reference made to the enclosed drawings, where.

DETAILED DESCRIPTION OF THE INVENTION

Figure 1:
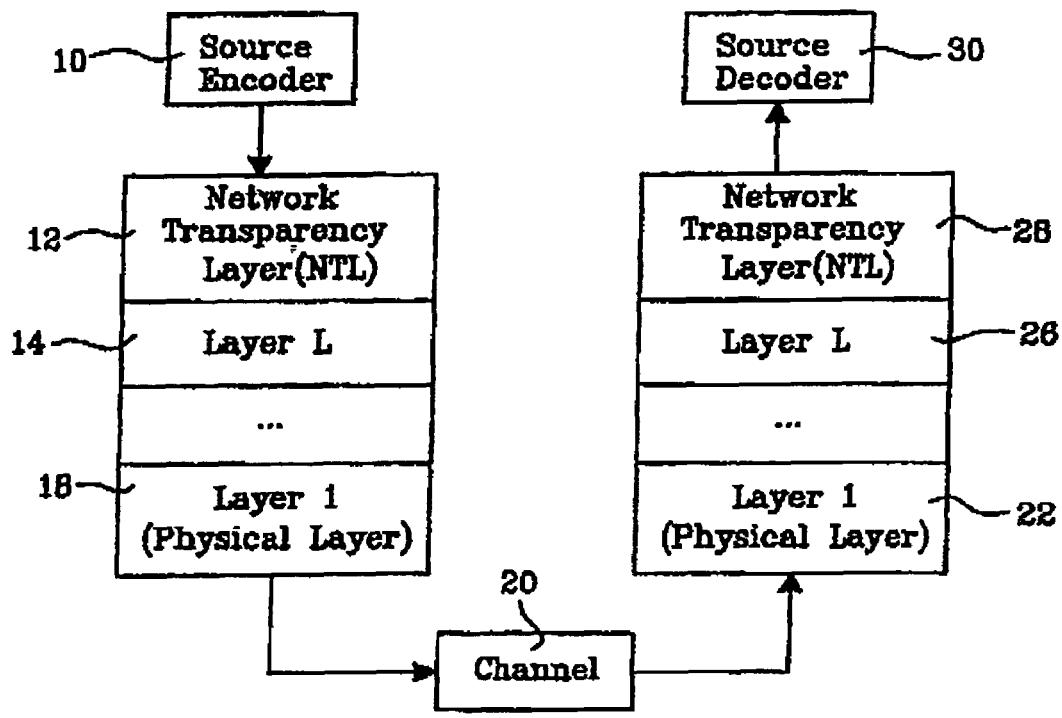
FIG. 1 shows a layer structure for the present invention

In FIG. 1 is shown a vertical layer structure used for understanding the invention. On the left side of the figure is a sender side, while a receiver side is provided on the right side of the figure. In a device having a certain application, there is a source encoder coding the application according to rules set out for that application. In a preferred embodiment of the present invention the source encoder 10 is an MPEG-4 video encoder, but it should be understood that the present invention is not limited to MPEG-4 video encoders, but can be implemented for any application that supports data partitioning tools and/or scalability in terms of quality layers (base/enhancements layers). The source encoder 10 is provided on the sender side of the layer structure and connected to a Network Transparency Layer (NTL) 12. The network transparency layer is connected to a Layer L 14, which in turn is connected to a physical layer 18 via at least one intermediate layer. The intermediate layers are indicated by a box containing dots. The physical layer 18 is connected to a physical channel 20 connecting the sender and receiver sides. The physical channel can be any type of channel like for instance copper wire, optical or wireless. In the preferred embodiment of the invention the channel is a wireless channel. On the receiver side there are corresponding layers to the layers on the sender side. There is thus a physical layer 22 connected to a Layer L 26 via intermediate layers, a network transparency layer (NTL) 28 and a source decoder 30. The source decoder decodes the source-coded information such that the data can be played or viewed. As is well known within the art the different layers on the sender side add information to a source coded data stream, normally in the form of packet headers and the information added is removed in the corresponding layer on the receiver side. The structure in FIG. 1 is relevant both for understanding the prior art techniques as well as the technique according to the invention.

Figure 2:
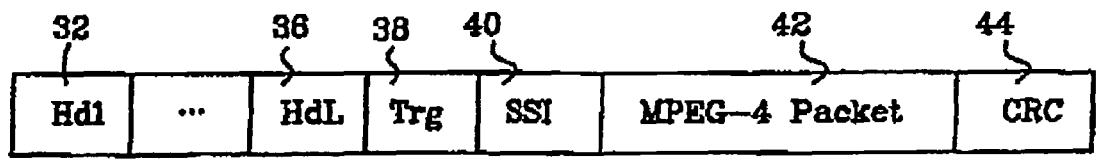
FIG. 2 shows a prior art SSI data packet

In FIG. 2 there is shown a packet according to the prior art. The packet includes a source-coded field 42, to which a trigger Trg 38 and SSI 40 have been added in the NTL layer of FIG. 1. The source-coded field is in itself a high-level data packet, for instance an MPEG-4 video packet. The Layer L has added a header HdL 36 to the packet. Headers from intermediate layers are indicated by a box containing dots. The physical layer 18 has added a header Hdl and a CRC field 44. As is clear from the figure, the different layers add information to the source data packets. Here in the form of headers. Packets having headers and CRC (Code Redundancy Check) fields are generated only starting from the layer L and lower layers down to layer 1. The data is also coded at different code rates, where the SSI headers indicate which data is to be channel coded at a particular rate and how long each of these fields is. The problem that can arise out of this structure will be better described in relation to FIG. 3.

Figure 3:
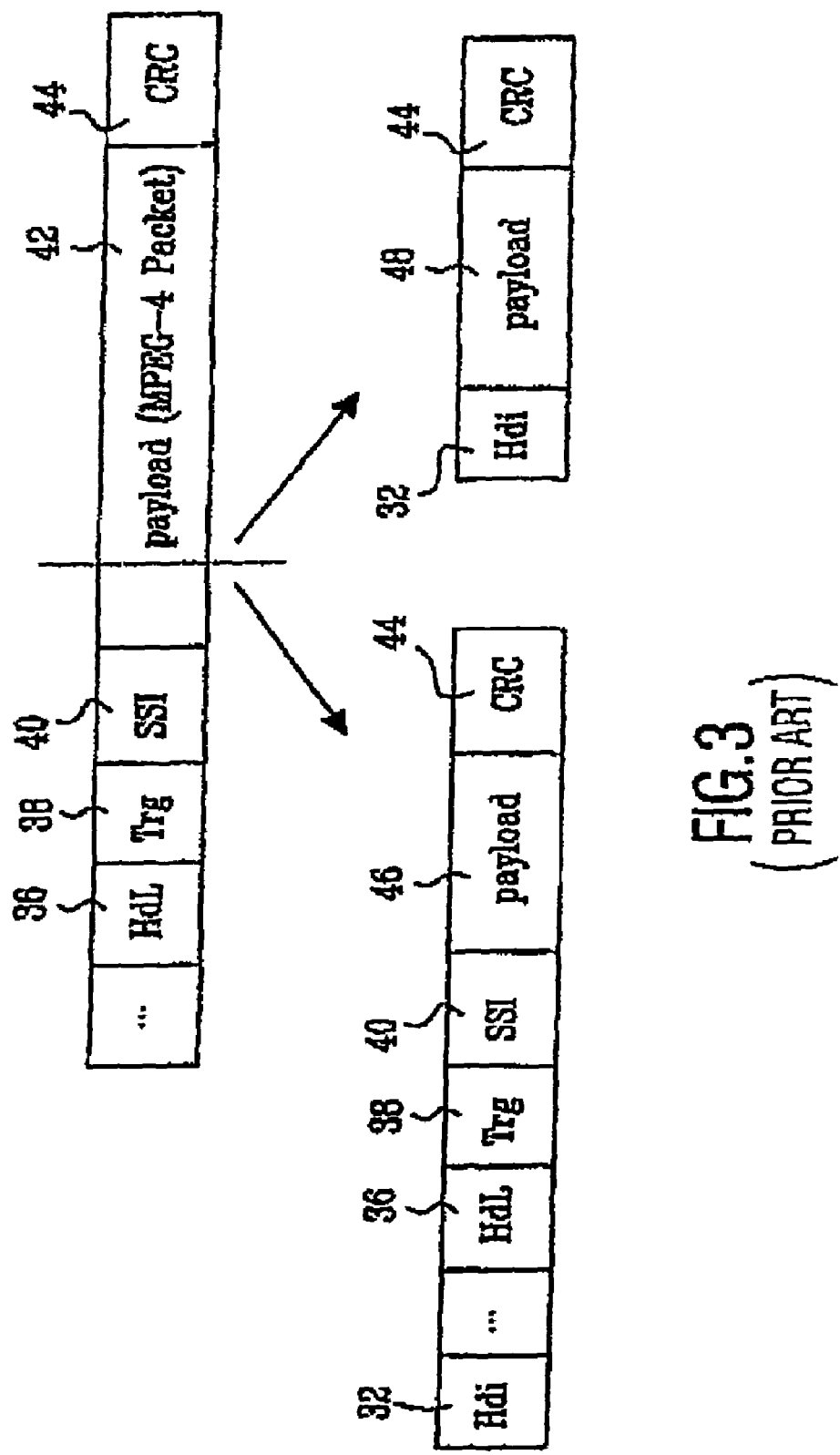
FIG. 3 shows data packet fragmentation of the prior art SSI data packet

FIG. 3 shows fragmentation of a prior art source coded data packet. All the fields present in FIG. 2 are here present in FIG. 3, with one major difference. The source-coded field 42 has been split into two fields 46 and 48 being present in two different packets. In the upper part of FIG. 3 there is shown a data packet at an intermediate layer, which has been split into two packets at the physical layer. What has happened is that in the physical layer, the original packet has been split in two, where a first part, from field 34 to the dashed line in field 42, is put in a first packet with a header Hdi and CRC field 44, whereas the second part 48 of the field 42 is put in a second packet with a header Hdi 32 and CRC field 44. The data has furthermore been UEP coded according to the information in the SSI field. This type of fragmentation can appear because the physical layer has size limitations on the packets and therefore an upper layer packet is split into two parts. What happens is that when the second packet reaches the receiving side, it cannot be decoded, because it does not include an SSI field indicating the code rates for the data in field 48. This leads to a loss of information and a worse performance of the source decoder. It should also be understood that this fragmentation is in no way limited to the physical layer, but can take place at any layer below the network transparency layer.

In order to overcome this problem the structure according to the invention is used. First a short explanation of the MPEG-4 format will be described. As is well known in the art, the data of the MPEG-4 data stream is divided into partitions, these being a header, motion data and texture data. These partitions can then be protected with different code rates. This MPEG-4 video data stream is a stream of high-level data packets.

Figure 4:
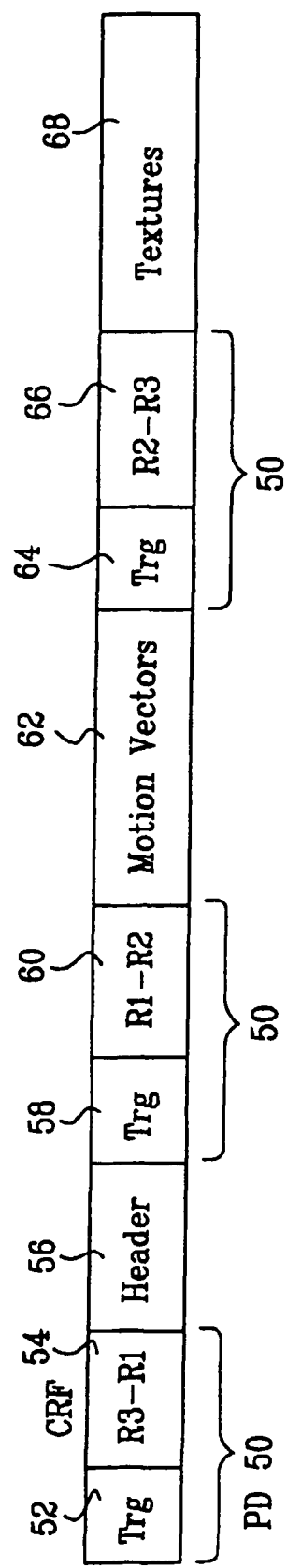
FIG. 4 shows a data packet according to the invention

This structure is described in FIG. 4. The packet shown in FIG. 4 is a packet from the NTL layer of FIG. 1. The packet includes a first partition detector 50 including a trigger Trg 52 and a code rate field CRF 54 including information about the code rate transitions between different partitions. A header 56 follows the code rate field 54. Then follows a second partition detector 50 having a trigger Trg 58 and a code rate field CRF 60, followed by the motion vectors, 62 of the MPEG-4 data. After this field 62 follows a third partition detector 50 including a trigger Trg 64 and code rate field 66. After the third partition detector follows a texture field 68. The header 56, motion vectors 62 and textures 68 are the MPEG-4 data formed into a high-level data packet by the source encoder of FIG. 1, while the three partition detectors are inserted in the NTL layer of FIG. 1. The partition detectors include a trigger. The trigger is preferably implemented in the form of a PN (Pseudo-Noise) word that is detectable by correlation and sufficiently robust against channel errors. The code rate field has a known length and contains transitions between code rates. The CRF is unique for each type of transition. In FIG. 4 this is indicated by the letters R3–R1, R1–R2 and R2–R3, where R1 is a first code rate, R2 a second code rate and R3 a third code rate. The code rate field thus includes information about the transition from a third code rate R3 to a first code rate R1, a transition from the first code rate R1 to the second code rate R2 and a transition from the second code rate R2 to the third code rate R3. This means that data, or the partition before the first partition detector is to be coded with the third code rate R3, the partition in-between the first and second partition detectors is to be coded with the first code rate R1, the partition between the second and third partition detector is to be coded with the second code rate R2 and the partition following the third partition detector is to be coded with the third code rate R3. This also means that all these CRFs look different. In one preferred embodiment of the invention the actual coding to be used is found by looking in a table containing the code rates associated with all CRFs. The CRFs and code rates are thus mapped onto a table. Alternatively the code rates can be extracted directly from the CRFs by logical processing. The information about what coding a certain partition should have can furthermore be present in two CRFs of the data stream. A further advantage is that a CRF is not describing how long each partition is, why they can be of varying lengths. This leads to a more robust and flexible system as will be described in the following. This also leads to headers added after the insertion of partition detectors being coded.

Figure 5:
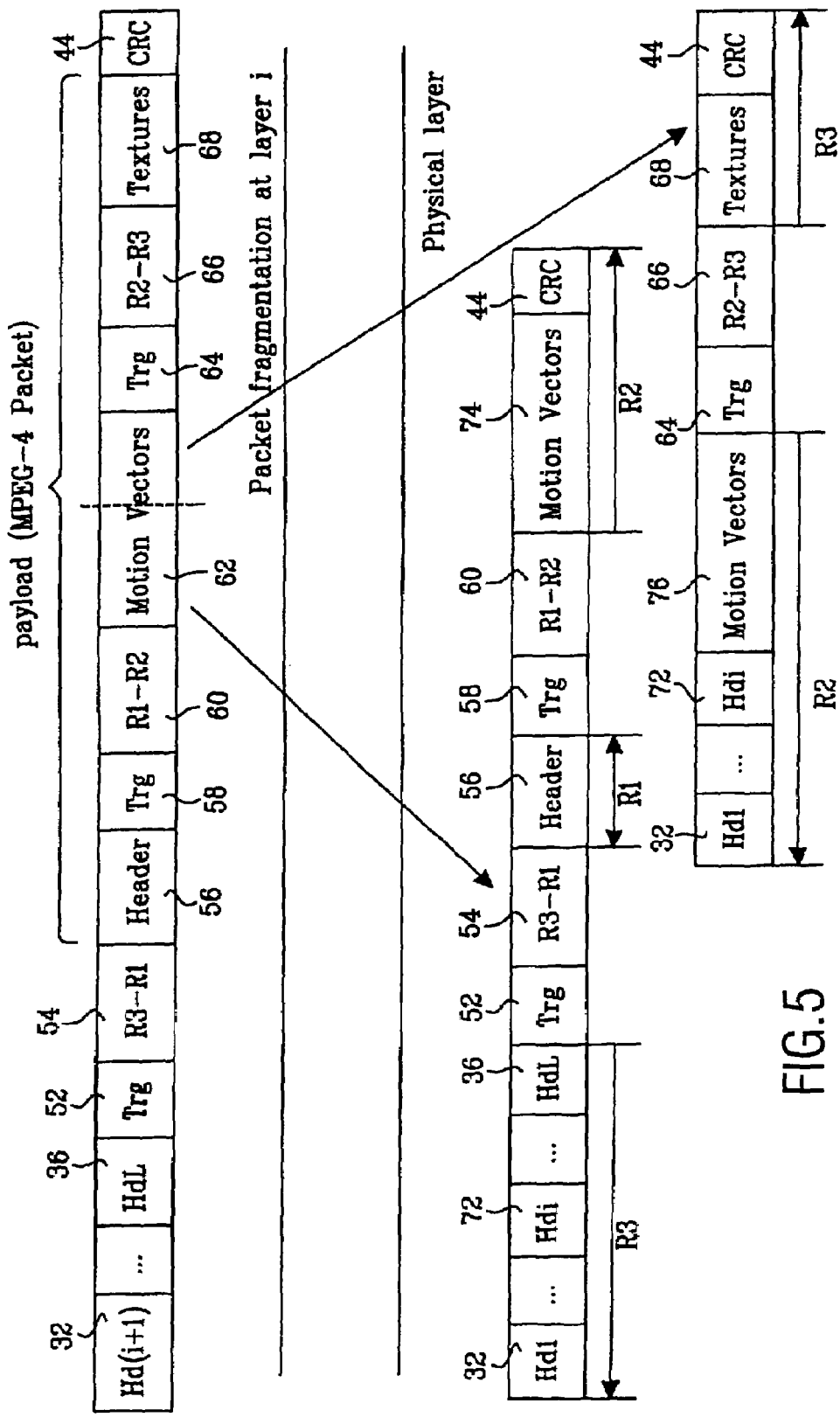
FIG. 5 shows packet fragmentation of the data packets according to the invention.

The upper part of FIG. 5 shows a data packet in a lower layer just before fragmentation and the lower part of FIG. 5 shows the information in that packet at a further lower layer after fragmentation. In the upper part of FIG. 5 is shown a data packet having a header 72 Hdi associated with one of the layers I in the layer structure followed by at least one other field associated with intermediate layers. Thereafter follows a header field 36 HdL associated with a layer L just below the NTL layer in the structure of FIG. 1. After this header follows the data fields described in FIG. 4 and ended by a CRC field 44 associated with one of the headers in the beginning. Packet fragmentation does then take place at layer i, where a header 72 is added. The packet from the upper part of FIG. 4 is split in the middle of the motion vectors 62, such that a first packet is formed including all the fields described above up to the motion vectors 74 and a CRC field 44 is added. A second packet is then formed with header Hdi, 72 and a second part of the motion vectors 76, the third CRF field 66, the textures field 68 and a CRC field 44. The packet in the lower part of FIG. 5 is actually not the packet formed at layer i, where fragmentation took place, but rather a lower layer and in this case the physical layer. Therefore both packets are added with the headers of lower layers (indicated by box with dots), till the physical layer, which is indicated by 32. At the physical layer, channel coding of the different fields is applied. This is indicated by the black arrows under the packets, so that a first arrow R3 indicates that the headers of the first packet has been coded with the code rate R3, header 56 with code rate R1 and motion vectors 74 together with CRC field 44 with code rate R2. In the second packet headers 32–72 and the rest of the motion vectors 76 are coded with code rate R2, while the textures and CRC field 44 are coded with code rate R3. In FIG. 5 there is thus shown a signal according to the invention. As can be seen from to figure, protocol headers are protected with the same code rate as the adjacent partition of the coded stream. Furthermore, additional coding may be performed at the physical layer in order to guarantee a minimal level of protection for all the protocol headers.

With the described structure no length information regarding the different partitions is needed. Also, even if packet fragmentation occurs just over a partition detector, the channel encoder is able to properly protect the MPEG-4 partitions anyway. If the trigger is thus corrupted, it is not detectable anymore. However, a channel encoder can recover the proper code rate by detecting the next PD. A fragmentation occurring over the CRF would generally lead to some code violation, thus detecting the CRF fragmentation. Also here a channel encoder can recover the proper code rate by detecting the next PD.

Figure 6:
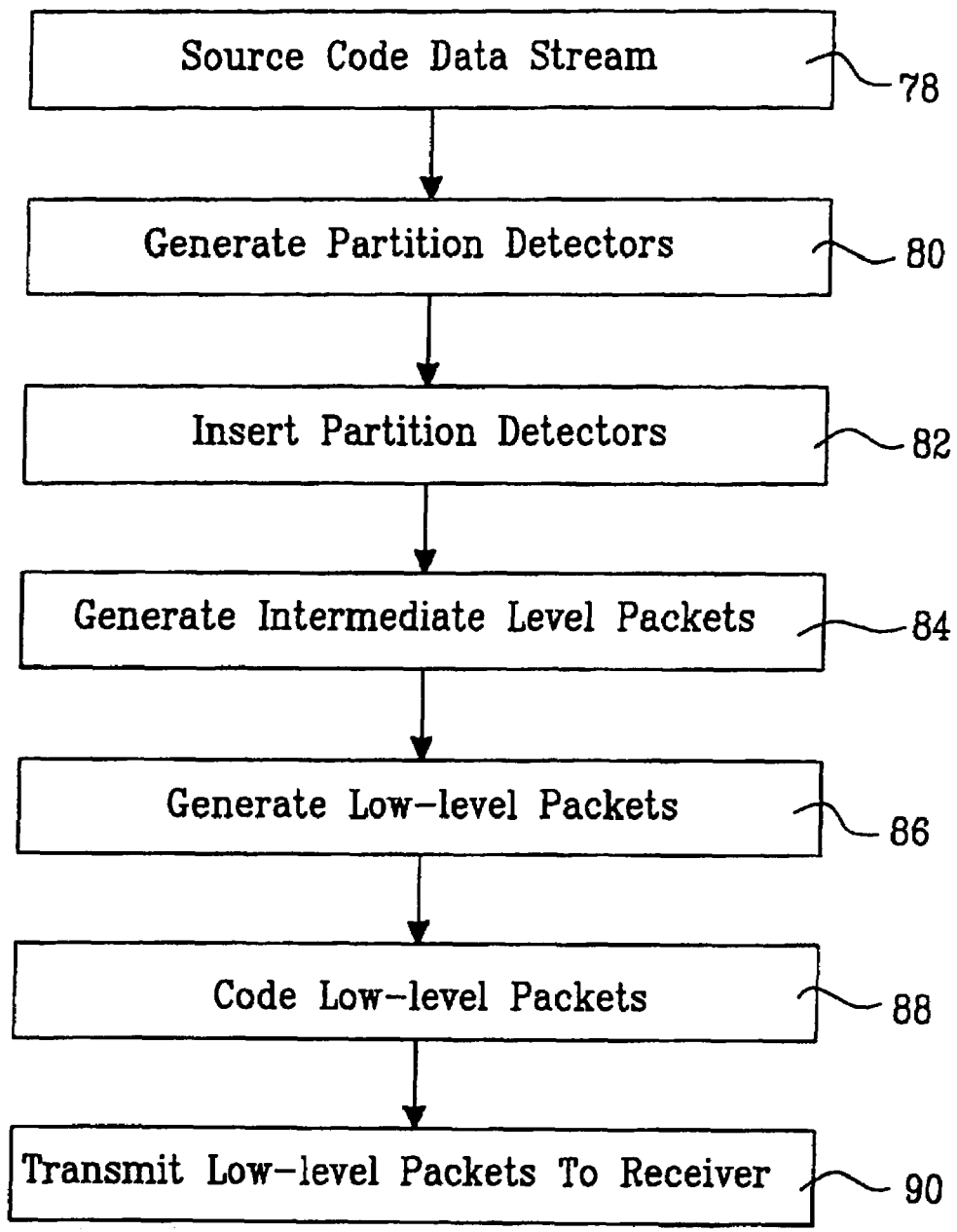
FIG. 6 shows a flow chart of a method of inserting partition detectors according to the invention

FIG. 6 shows a flow chart describing the method according to the invention. First a data stream is source coded into a number of high-level packets, step 78, where each packet includes MPEG-4 information. Thereafter partition detectors are generated, step 80. When these have been generated, the partition detectors are inserted in the source coded data stream, step 82. Thereafter the first layer L generates intermediate level packets, step 84, by adding a header and possible CRC fields to the packets in the data stream. In the following step, step 86, low-level packets are generated by adding a further header and a CRC field. It is very possible and in fact highly likely that further headers and possible CRC fields are added in intermediate layers after step 86. Thereafter the data packets are channel coded using different code rates in dependence of the inserted partition detectors, step 88. The low-level packets are then transmitted to a receiver over a communication channel, step 90.

Figure 7:
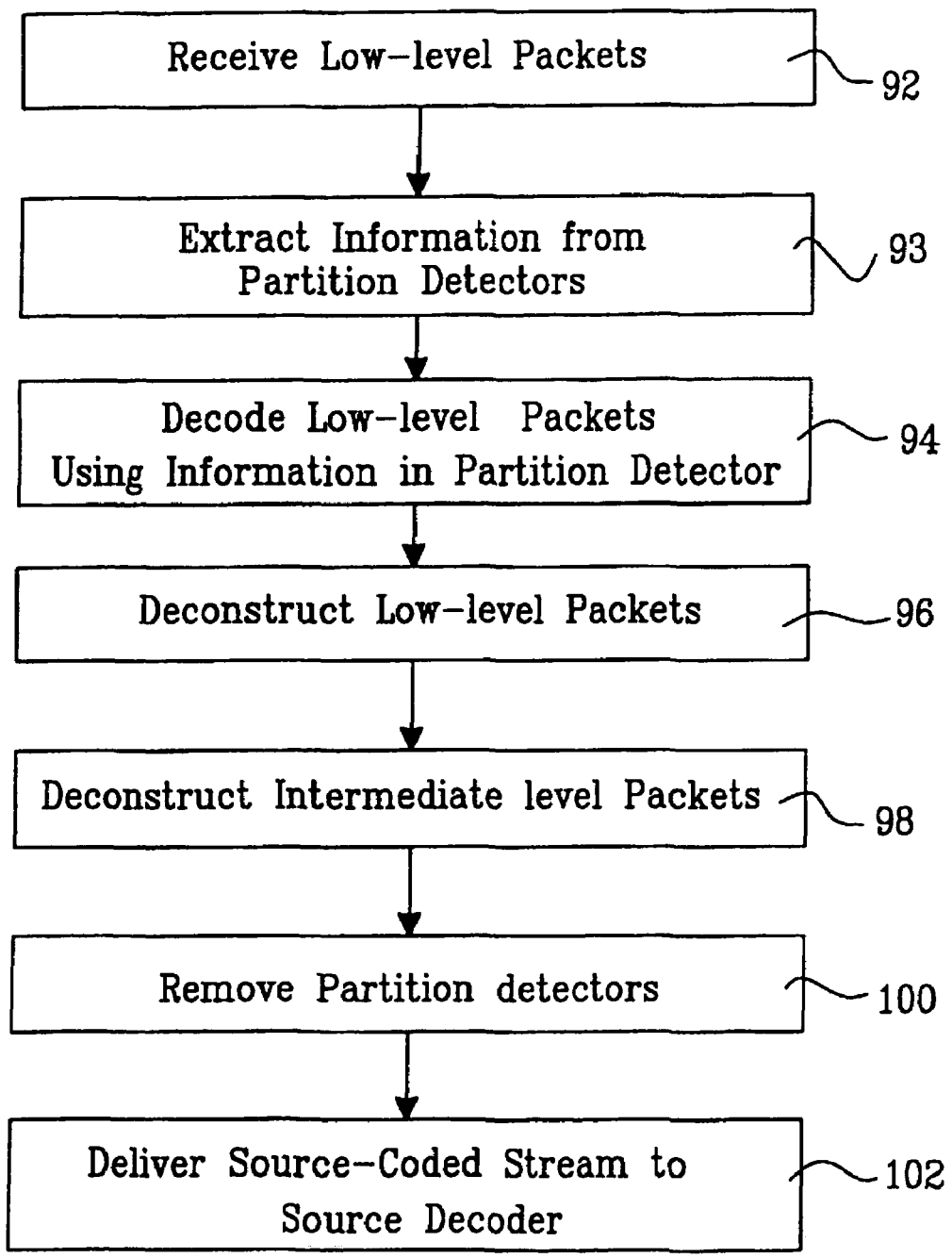
FIG. 7 shows a flow chart of a method of receiving a coded data stream and FIG. 8 shows an apparatus for inserting partition detector according to the invention.

FIG. 7 shows a flow chart of a method for receiving a coded data stream that has been transmitted over a channel. In step 92, the low-level data packets are received. Thereafter the information in the partition detectors is extracted, step 93. Then the low level data packets are decoded, step 94. These two steps are done by detecting the occurrence of partition detectors and then decoding the differently coded partitions before and after these detectors. When the packets have been decoded, the low-level data packets are deconstructed, step 96. Thereafter the intermediate level data packets of the layer L embedded in the low level packets are deconstructed, step 98. As on the sender side there can be several intermediate layers where the packets for these layers are deconstructed. Deconstructing is performed by removing the header associated with that layer and any possible added information fields and possible CRC fields associated with that layer. Thereafter the partition detectors are removed at the NTL layer, step 100 and the source coded data stream of high-level data packets is delivered to a source decoder, step 102.

Figure 8:
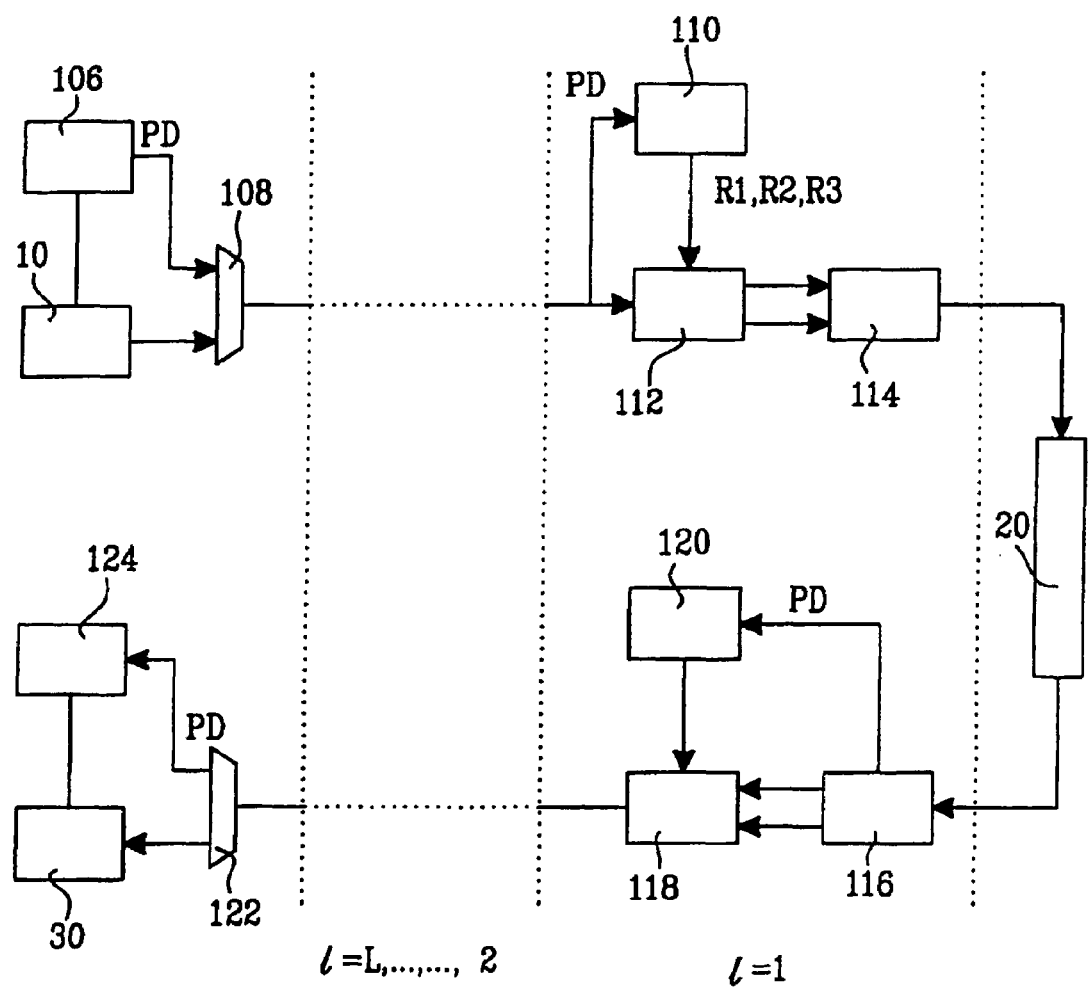

Finally FIG. 8 shows a block schematic of a transmitting device and a receiving device connected via a channel. In the transmitting device a source encoder 10 is connected to a PD (Partition Detector) generator 106 and to a multiplexer or PD inserter 108. The PD generator generates unique partition detectors for different partitions in the source code. As described earlier these partition detectors indicate the transition between different code rates. The multiplexer or PD inserter 108 then inserts these partition detectors between the different partitions in the source coded data stream of high-level data packets. The multiplexer can be seen as being placed in the NTL layer. In the figure the multiplexer 108 is connected to a channel encoder 112, which encoder is placed in the physical layer, layer 1. The figure includes dotted vertical lines. These indicate that there can be several different intermediate layers between the NTL layer and the physical layer. The channel encoder 112 is controlled by a controller 110. This controller identifies the partition detectors in the data stream. As described earlier the trigger or PN-sequence is what makes the controller 110 start working. The unique CRF field following the PN-sequence then indicates the code rate to be applied to the partitions before and after the partition detector. The controller has in the preferred embodiment access to or includes a table identifying which code rates are to be used for a certain partition detector. The controller 110 thereafter sends information about the code rates to be used to the channel encoder 112, which applies UEP channel coding to the thus identified partitions using the different code rates and generates low-level data packets. The data stream is then sent to a modulator 114, which modulates the low-level data stream. The modulator 114 is connected to a physical channel 20 for sending the modulated data 20, which channel may be wireless.

The receiving device includes a demodulator 116, which demodulates the received data of low-level data packets and extracts information from the partition detectors in the data stream. The information in the partition detectors is furnished to a controller 120, which is connected to a channel decoder 118. The controller 120 makes the channel decoder decode the UEP channel coded demodulated data stream in accordance with the information in the partition detectors. This information is preferably identified by looking in a table. All these devices are provided in the physical layer. In the same way as the transmitting device, the decoder 118 of the receiving device is connected to a demultiplexer or PD extractor 122 via possible intermediate layers, which demultiplexer is arranged in the NTL layer. The demultiplexer is connected to a partition detector receiver 124 and to a source decoder 126. The demultiplexer separates the partition detector from the actual data stream of coded data, which in the preferred embodiment is MPEG-4 video signals, so that the source decoder receives the high-level coded data packets without partition detectors.

The coding of the coded data is in the preferred embodiment made in the physical layer. It can however be done in any other layer. It is important though that the partition detectors are inserted and extracted in close proximity to the original coded data stream, why this is done in the closest layer after the source encoder/decoder, this mainly because the following headers and check sums are dependent on the payload of a packet, which includes the partition detectors. The number of layers is also not a deciding factor. In its simplest form, the source encoder and the source decoder only uses two layers, the NTL layer and the physical layer.

The controller 110 and 120 on the receiver side can either be provided with tables which identifies the coding rates associated with a partition detector or logic circuits for extracting code rates from the partition detectors or some other means fort extracting the code rates from the partition detectors.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word 'comprising' does not exclude the presence of other elements or steps than those listed in a claim. The invention can be implemented by means of hardware comprising several distinct elements, and by means of a suitably programmed computer. In a device claim enumerating several means, several of these means can be embodied by one and the same item of hardware. The mere fact that certain measures are recited in mutually different dependent claims does not indicate that a combination of these measures cannot be used to advantage.

The invention claimed is:

1. Method of coding a data stream, comprising:
providing the data stream including a high level data packet having at least two partitions of data with different code rates; and
inserting a partition detector between the two partitions to provide information for coding the two partitions with the different code rates.

2. Method according to claim 1, further comprising generating a partition detector.

3. Method according to claim 1, where the partition detector includes a trigger and a code rate field.

4. Method according to claim 3, wherein the code rate field gives information regarding the code rates to be used for the two partitions.

5. Method according to claim 4, wherein the code rate field is an identifier of the transition from a first code rate to be associated with one of the partitions to a second code rate associated with an other of the partitions.

6. Method according to claim 1, further comprising generating low-level data packets including the high-level data packet as payload.

7. Method according to claim 6, further comprising coding the low-level data packets with different code rates determined by the partition detector.

8. Method according to claim 7, wherein the partition detectors are not coded.

9. Method according to claim 7, further comprising sending the coded low-level data packets to a receiving device.

10. Method according to claim 1, further comprising at least three partitions such that the partition detector is inserted after every partition.

11. Method of decoding a coded data stream, comprising:
receiving the coded data stream including at least one low level data packet having at least two partitions coded with different code rates;
extracting information from a partition detector inserted between the two partitions in the low level data packet; and
decoding the two partitions using the different code rates based upon code rate information extracted from the partition detector.

12. Method according to claim 11, further comprising forming at least one high level data packet out of the decoded low level data packets.

13. Method according to claim 12, further comprising removing the inserted partition detector from the data stream.

14. Method according to claim 13, further comprising supplying the data stream including at least one high level data packet to a source decoder.

15. A device for coding a coded data stream, comprising:
at least one high level data packet including at least two partitions of data with different code rates;

a partition detector inserter for inserting a partition detector between the two partitions to provide information for coding the two partitions with the different code rates.

16. A device for decoding a coded data stream having at least two low level data packets including partitions of data having different code rates, comprising:

a controller for reading partition detector information inserted between the two partitions; and a decoder for decoding the two partitions at the different code rates obtained from the partition detector.

* * * * *